APPARATUS FOR ASSEMBLING ELECTRICAL CIRCUITRY

Filed Dec. 31, 1958

INVENTOR.
MALCOLM A. SANBORN

BY James T. Comfort

ATTORNEY

United States Patent Office 3,088,728
Patented May 7, 1963

3,088,728

APPARATUS FOR ASSEMBLING ELECTRICAL CIRCUITRY

Malcolm A. Sanborn, Kingston, N.Y., assignor, by mesne assignments, to the United States of America as represented by the Secretary of the Air Force Filed Dec. 31, 1958, Ser. No. 784,236
1 Claim. (Cl. 269—40)

This invention relates to a method of and apparatus for assembling a group of electronic components to present their leads in a predetermined pattern.

It is customary in the electronic art to build three-dimensional blocks of components which can be moved in and out of circuits as units. These blocks are in some cases formed by inserting the leads of the components in opposed parallel perforated boards, which are at right angles to the component leads, to establish a correct spacial relationship of the components and their leads. The leads are then connected in the required circuitry. The perforated boards may be printed circuit boards having circuits thereon to connect the leads in the desired circuit. The use of this type of electronic circuit block entails the problem of quick and facile assembly of the components. One way in which this assembly has been accomplished is to individually insert the leads through holes in the boards manually. Such a process is slow, tedious, and subject to errors. Other methods assemble the components in a fixed array with the leads in a correct pattern for simultaneous insertion into the perforated boards. Such a method followed in the past has made use of notched jigs into which the leads of components were pressed to hold the leads in a fixed relative position. The leads were then simultaneously inserted into the perforated boards.

The principle object of this invention is to provide an improved method and apparatus for setting up the components in such a way that their leads are presented in a predetermined pattern for simultaneous insertion into perforated boards.

A particular object is to provide a method and apparatus of the kind mentioned which provides for a higher speed of assembly.

Another object is to provide a method and apparatus of the kind described which lends itself to automation or semi-automation.

A furthter object is to provide a jig for assembly of electronic components which jig may be removed.

A particular advantage of the removability of the jig is that after component leads have been inserted into the perforated boards the jig may be removed and the component assembly may be potted. The perforated boards may then be removed to present the leads in an accurate predetermined pattern which may be connected by predetermined circuitry which may be embedded into or applied to the walls of the potted block. The assembly may also be potted before removal of the jig.

It is therefore another object of this invention to provide an improved method and apparatus of the kind described for assembling electronic components so their leads present a predetermined pattern which may be connected by predetermined circuitry.

Briefly the invention consists of a method of assembling a group of electronic components to present their leads in a predetermined pattern. The leads of subgroups of components are inserted in parallel slots of a jig. Parallel fingers oriented perpendicular to said slots are interposed between successive subgroups to locate the leads in a predetermined pattern. The apparatus of this invention consists of an assembly jig for assembling a group of electronic components to present their leads in a predetermined pattern. The assembly jig comprises two opposed plates having a plurality of paired parallel slots, and a plurality of paired parallel fingers. The leads of the electronic components may be moved into the paired slots and the paired fingers then may sequentially position the leads in the paired slots.

Other objects of the invention will be pointed out in the following description and claim and illustrated in the accompanying drawings, which disclose, by way of example, the principle of the invention and one mode, which has been contemplated, of applying that principle.

Figures 1, 2:
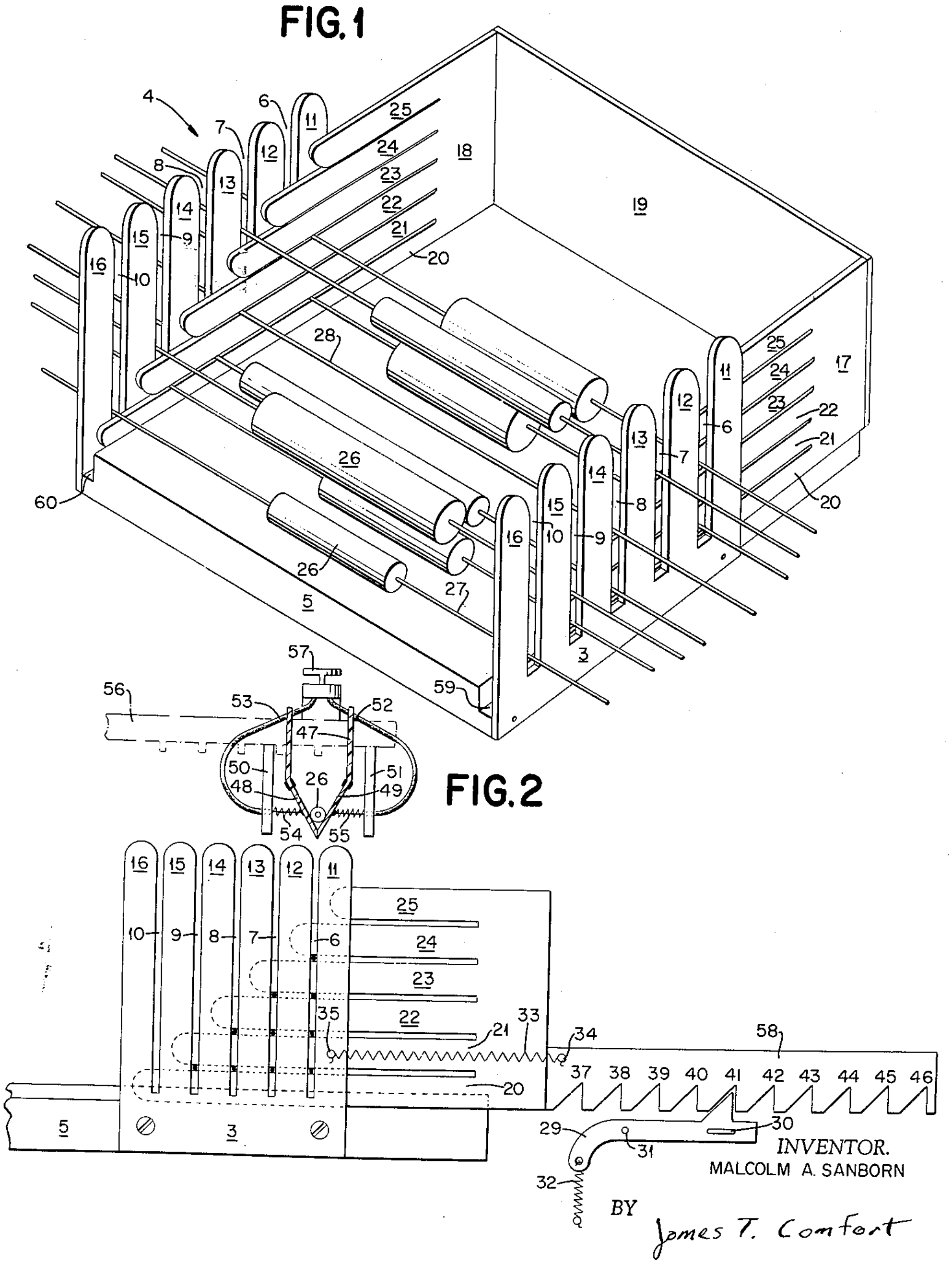
FIG. 1 is an isometric view of an assembly jig embodying the invention.
FIG. 2 is a schematic side view of FIG. 1 showing how the invention may be semi-automated.

Referring to FIG. 1 for a description of the structure of the assembly jig, plates 3 and 4 attached to and supported by plate 5 are divided into pairs of slots 6—10 separated by pairs of fingers 11—16. Plates 17 and 18 attached to and supported by plate 19 are divided into pairs of fingers 20—25. Pairs of fingers 20—25 are stepped so that the leading edge of each pair of fingers will intersect a different pair of slots 6—10 as the pairs of fingers are advanced in a direction substantially parallel to their length towards intersection with the slots. To this end, plates 17 and 18 and fingers 20—25 borne thereby slide in grooves 59 and 60 respectively. Components 26 are suspended between plates 3 and 4 and 17 and 18 by their leads 27 as is jumper wire 28.

Now referring to FIG. 2, a side view of the assembly jig illustrated in FIG. 1 shows a schematic of apparatus which may be used to semi-automate the assembly of components in the assembly jig of this invention. Spring 33 attached to plate 3 by stud 35 and ratchet 58 by stud 34 urges fingers 20—25 towards intersection with slots 6—10. Dog 36 on lever 29 pivoted about point 31 is urged in a counter-clockwise direction by spring 32 to selectively engage teeth 37—46 on ratchet 58. Component chute 47 attached to rack 56 may be positioned above any slots 6—10. Knob 57 is attached to two wires in cables 52 and 53 which are attached to chute blades 48 and 49. Compression springs 54 and 55, compressed between chute blades 48 and 49 and support plates 50 and 51 respectively, close chute 47.

Referring to FIGS. 1 and 2 together for a description of semi-automatic operation to the assembly jig, component 26 is placed in chute 47 positioned above slot 6. The leading edges of pair of fingers 20 are positioned to intersect pair of slots 6. Knob 57 is pulled which opens chute 47 and allows the leads of component 26 to drop into pair of slots 6 until checked by fingers 20. This positions the leads at the intersection of fingers 20 and slots 6. Lever 29 is then depressed releasing dog 36 from tooth 37 and permitting it to engage tooth 38 thus advancing fingers 20—25 one position. The leading edge of fingers 20 now intersect slots 7 while the leading edges of fingers 21 intersect slots 6. Chute 47 first releases a component into slot 6, then is positioned above slot 7 releasing a component into slot 7, allowing the leads to naturally fall in slots 6 and 7 until stopped by fingers 20 and 21. Component leads have now been positioned at the intersection of slot 6 and fingers 20 and 21 and slot 7 and finger 20. Fingers 20—25 are advanced one position at a time and components are dropped in slots 6—10 allowing the leads to be positioned at the intersection of fingers 20—25 and slots 6—10 until all of the desired intersections are filled.

It may be observed that jumper wires such as jumper wire 28 in FIG. 1 may be positioned the same as components. For the most accurate positioning of the leads and jumper wires uniform size leads and jumper wires should be used. The tolerances may be made greater at the intersection of the slots and fingers if various size leads and jumper wires are used but the positioning will not be as accurate.

After the components have been assembled in the jig so their leads present a pattern of intersection of the fingers and slots the leads may be inserted into a perforated board such as a printed circuit board and the jig may be easily removed. Alternatively, perforated boards may act as temporary support while the assembly is potted in place by well-known techniques to position the component leads in a pattern of intersection of the fingers and slots. The boards may then be removed after potting to allow the leads to be connected by predetermined circuitry which may be embedded into or applied to the walls of the potted block. The assembly may also be potted before removal of the jig. The jig may be constructed of an inexpensive material and become part of the final circuit package.

The apparatus shown for semi-automatic operation of the assembly jig is illustrative only and to those skilled in the art it is obvious that numerous well-known principles might be applied to fully automate the assembly of components utilizing the principles of this invention. The assembly jig might also easily be operated by hand.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claim.

What is claimed is:

An assembly jig for assembling electronic components to present their leads in a predetermined pattern comprising first and second plates secured in spaced parallel relation, each of said plates having a plurality of uniformly spaced vertical fingers separated by vertical slots of equal depth, said slots on said first plate being opposed to said slots on said second plate, third and fourth plates secured in spaced parallel relation, each of said last named plates having a plurality of uniformly spaced horizontal fingers separated by opposed horizontal slots, said horizontal fingers decreasing uniformly in length from the bottom to the top of said last named plates with adjacent fingers varying in length by an amount equal to a multiple of the distance between center lines of said vertical slots, and guide means providing for movement of said third and fourth plates in a horizontal direction perpendicular to the vertical slots of said first and second plates so that opposed fingers of said third and fourth plates intersect the opposed slots of said first and second plates.

References Cited in the file of this patent

UNITED STATES PATENTS

| | | |
|---|---|---|
| 1,410,716 | Peers | Mar. 28, 1922 |
| 2,336,541 | Gunter et al. | Dec. 14, 1943 |
| 2,377,904 | Roach | June 12, 1945 |
| 2,699,133 | Ames | Jan. 11, 1955 |
| 2,779,993 | Pityo | Feb. 5, 1957 |
| 2,870,728 | Goodykoontz | Jan. 27, 1959 |
| 2,871,549 | Arnold | Feb. 3, 1959 |
| 2,878,069 | Wessel | Mar. 17, 1959 |